United States Patent [19]

Senn et al.

[11] Patent Number: 4,924,189

[45] Date of Patent: May 8, 1990

[54] TWO-PORT SWITCHED CAPACITOR FILTER NETWORK WITH LINEARIZED PHASE/FREQUENCY RESPONSE

[75] Inventors: Patrice Senn; Mohamed S. Tawfik, both of Grenoble, France

[73] Assignee: L'Etat Francais, represente par la Ministre Delegue des Postes et Telecommunications, (Centre National d'Etudes des Telecommunications), Issy Les Moulineaux, France

[21] Appl. No.: 235,494

[22] Filed: Aug. 24, 1988

[30] Foreign Application Priority Data

Aug. 26, 1987 [FR] France ................ 87 11962

[51] Int. Cl.⁵ ............... H03H 11/12; H03H 19/00
[52] U.S. Cl. .................... 328/167; 307/520; 328/127; 330/109; 333/173
[58] Field of Search ............ 307/520, 521, 522, 556, 307/543; 328/165-167, 138, 127, 151; 333/173; 330/9, 109

[56] References Cited

U.S. PATENT DOCUMENTS

| 4,429,281 | 1/1984 | Ito et al. ................... 330/9 |
| 4,520,283 | 5/1985 | Sasaki et al. .............. 307/520 |
| 4,769,612 | 9/1988 | Tamakoshi et al. .......... 328/167 |
| 4,835,482 | 5/1989 | Tamakoshi et al. .......... 328/167 |

FOREIGN PATENT DOCUMENTS 0083321  6/1980  Japan ..................... 307/556

OTHER PUBLICATIONS

Archiv Für Elektronik Und Übertragungstechnik, vol. 36, No. 4, Apr. 1982, pp. 141-147, Würzburg, Federal Republic of Germany; Bernhard Huber et al: "Design of a Switched-Capacitor Filter for Viewdata Modems". Patent Abstracts of Japan, vol. 5, No. 78 (E-58) [750], May 22, 1981; & JP-A-56 25 820 (Nippon Denki K. K.) 12-03-1981.
"Synthesis of Switches-Capacitor Circuit Simulating Canonical Reactance Sections", Georg J. Smolka, IEEE Trans. Circuits and Systems, vol. Cas-32, pp. 513-521, Jun. 1985.

Primary Examiner—Stanley D. Miller
Assistant Examiner—Terry Cunningham
Attorney, Agent, or Firm—Foley & Lardner, Schwartz, Jeffery, Schwaab, Mack, Blumenthal & Evans

[57] ABSTRACT

A two-port switched capacitor filter network of the type comprising two input terminals (4, 6), two output terminals (8, 10) and at least three integrator circuits (12, 14, 16) connected therebetween, each integrator circuit including two inputs provided with capacitors which are switched under the control of two disjoint clock states, said integrator circuits being interconnected to constitute a sampling filter having a selected amplitude/frequency response. The two-port network includes two other integrator circuits (36, 38) whose respective inputs are fitted with capacitors switched under the control of two disjoint clock states, said other integrator circuit being interconnected with each other and with the first-mentioned integrator circuits in order to linearize the phase/frequency response of said filter.

8 Claims, 4 Drawing Sheets

TWO-PORT SWITCHED CAPACITOR FILTER NETWORK WITH LINEARIZED PHASE/FREQUENCY RESPONSE

The present invention relates to switched capacitor sampling filters. More particularly, it relates to a two-port switched capacitor filter network in which the phase/frequency response of the filter is linearized. It is applicable to telecommunications apparatuses such as modems, data transmission apparatuses, and video communications apparatuses which require filters in the form of integrated circuits and having a linear phase/frequency response since the human eye is sensitive to phase/frequency distortion in such filters.

BACKGROUND OF THE INVENTION

In general, switched capacitor sampling filters are provided in the form of integrated circuits in a so-called "ladder" structure constituted by interconnected integrator circuits whose respective inputs are provided with capacitors that are switched by two disjoint clock states.

Minimum phase switched capacitor filters are known in which the phase/frequency response is not linear but in which the phase shift between the input and the output of the filter is at a minimum. Minimum phase filters include so-called "Chebyschev" filters having a level passband and straight amplitude/frequency attenuation. The cut-off in the amplitude/frequency response curve is steep, whereas the phase/frequency response curve increases irregularly at the transition frequency of the filter, i.e., in the vicinity of said transition frequency, the signal propagation time or the group delay increases. There are also so-called "Bessel" filters in which the cut-off in the amplitude/frequency response curve is not sharp. The group delay is constant, i.e. phase varies linearly with frequency, or in other words the phase shift between the input and the output of the filter is linear as a function of frequency. Minimum phase filters are unsatisfactory since in Chebyschev filters phase does not vary linearly with frequency and in Bessel filters the amplitude attenuation characteristic is neither sharp nor curvilinear.

In order to remedy these defects, the article "Synthesis of Switched-Capacitor Circuit Simulating Canonical Reactance Sections", by Georg J. Smolka, in IEEE Trans. Circuits and Systems, VoL. Cas-32, pages 513–521, June 1985, proposes a switched capacitor filter of the non-minimum phase type whose structure does not change amplitude/frequency attenuation but does change phase/frequency response in order to linearize it. This filter is organized in a ladder structure and is derived from a passive component LC circuit which is transformed by means of a signal flowgraph. It comprises five interconnected integrator circuits, with three of them constituting the integrating portion of the ladder circuit. It also includes two inverters, e.g. constituted by two inverting operational amplifiers, interposed between the three integrators of the ladder circuit and the other two integrator circuits which are inserted in the ladder circuit in order to linearize the phase/frequency response.

However, this type of filter is not satisfactory since it includes too high a number of active elements (operational amplifiers, inverters, switched capacitors). In addition, this filter requires six clock phases in order to operate, and this considerably complicates the clock generator. Finally, inserting this six clock phase filter in a conventional two clock phase ladder circuit constitutes a technological problem which is difficult to solve.

The object of the invention is to provide a solution to this problem. To this end, the invention provides a two-port switched capacitor filter network in which the phase/frequency response is linearized and which makes use of only two clock phases for switching the capacitors connected at the respective inputs of the integrator circuits.

SUMMARY OF THE INVENTION

The present invention provides a two-port switched capacitor filter network of the type comprising two input terminals, two output terminals and at least three integrator circuits connected therebetween, each integrator circuit including two inputs provided with capacitors which are switched under the control of two disjoint clock states, said integrator circuits being interconnected to constitute a sampling filter having a selected amplitude/frequency response. According to a general definition of the invention, the two-port filter network includes two other integrator circuits whose respective inputs are fitted with capacitors switched under the control of two disjoint clock states, said other integrator circuits being interconnected with each other and with the first-mentioned integrator circuits in order to linearize the phase/frequency response of said filter.

A two-port filter network is already known in which a first one of said first-mentioned integrator circuits includes two inputs, one of which is connected to the first input terminal, and has its output connected to the first output terminal, wherein a second one of said first-mentioned integrator circuits includes two inputs, with its first input being connected to the output of the first integrator circuit, and with its output constituting the second input of the first integrator circuit, and wherein a third one of said first-mentioned integrator circuits includes two inputs, the first of which is connected to the output of the second integrator circuit, the second of which is connected to the second input terminal, and the output of which is connected to the second output terminal and also to the second input of the second integrator circuit.

Each of the first and third integrator circuits may be provided with an additional input; a fourth integrator circuit has three inputs, the first of which is connected to the output from the first integrator circuit and the second of which is connected to the output from the third integrator circuit, and its output is connected to the additional inputs of the first and third integrator circuits; and a fifth integrator circuit has a single input also connected to the output from the fourth integrator circuit and having its output connected to the third input of the fourth integrator circuit.

According to an aspect of the invention, at least some of the integrator circuits comprise: an operational amplifier; a non-inverting input connected to ground; and an inverting input connected to the various inputs of said integrator circuits via switch capacitors.

Each of the various inputs of an integrator circuit are defined by: a capacitor; and input switch suitable for establishing an electrical connection between one of the plates of the capacitor and either the input or ground; and a link switch member suitable for establishing an electrical connection between the other plate of the capacitor and either the inverting input or ground.

In practice, the link switch member comprises a switch suitable for establishing electrical connection between a node and either the inverting input or ground, with the various other plates of the input capacitors of the integrator circuit being interconnected at the node.

In a variant of the circuit of the invention, the link switch member comprises a plurality of switches each suitable for establishing an electrical connection between the other plate of a corresponding one of the input capacitors of the integrator circuit and either a respective electric contact point or else ground, with the electric contact points being interconnected and being connected to the inverting input of the integrator circuit.

According to another aspect of the invention, each inverting input of the integrator circuits is connected by a capacitor to the output from the operational amplifier of each integrator circuit.

In a preferred embodiment of the circuit of the invention, the output of the first integrator circuit is connected by a capacitor to the inverting input of the amplifier of the third integrator circuit, and the output from the third integrator circuit is connected via another capacitor to the inverting input of the amplifier of the first integrator circuit, thereby obtaining a switch capacitor sampling filter of the elliptical type.

BRIEF DESCRIPTION OF THE DRAWINGS

Embodiments of the invention are described by way of example with reference to the accompanying drawings, in which.

In many respects, the accompanying drawings include items which are definitive in nature. They may therefore be used not only for clarifying the following description, but also for contributing to the definition of the invention, where appropriate.

MORE DETAILED DESCRIPTION

Figure 1:
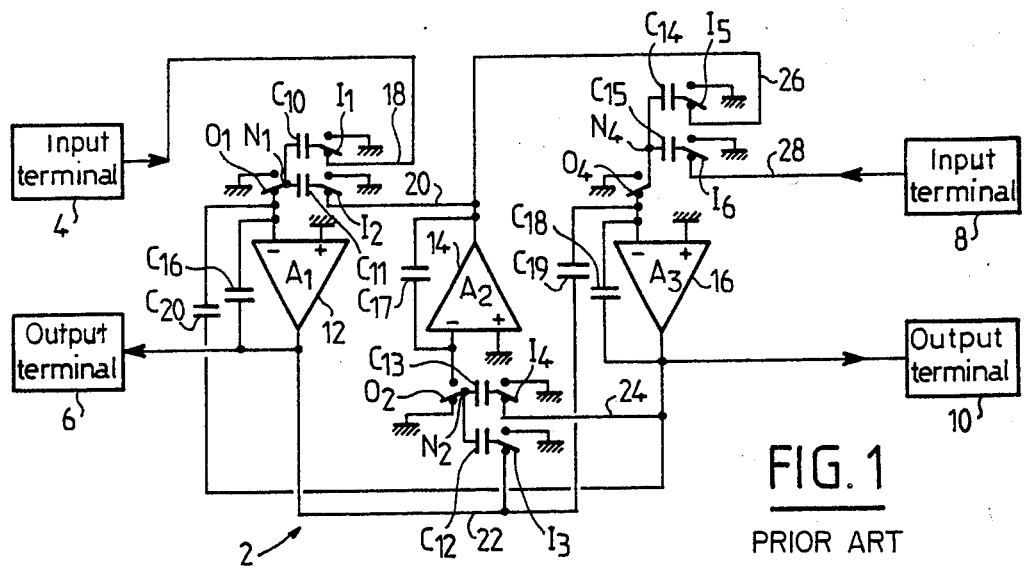
FIG. 1 is a circuit diagram of a prior art switched capacitor sampling filter comprising three interconnected integrator circuits.

In FIG. 1, reference 2 designates a two-port switched capacitor filter network which is well-known to the person skilled in the art. The two-port network 2 comprises two input terminals 4 and 8, two output terminals 6 and 10, and three integrator circuits 12, 14, and 16 organized in a ladder structure. The integrator circuits 12, 14, and 16 are interconnected to constitute a sampling filter of selected amplitude/frequency response, for example a lowpass type of filter.

The integrator circuit 12 has two inputs 18 and 20. The input 18 is connected to input terminal 4 and the output from the integrator circuit 12 is connected to input terminal 6.

Integrator circuit 14 has two inputs 22 and 24. Input 22 is connected to the output from integrator circuit 12. The output from integrator circuit 14 provides the input 20 to integrator circuit 12.

Integrator circuit 16 has two inputs 26 and 28. Input 26 is connected to the output of the integrator circuit 14. Input 28 is connected to output terminal 8. The output from integrator circuit 16 is connected to the output terminal 10 and also to the input 24 of integrator circuit 14.

Each of the integrator circuits 12, 14, and 16 includes a respective operational amplifier A1, A2, and A3, having its non-inverting input connected to ground and having its inverting input connected to the various inputs of said integrator circuits via switched capacitors.

The inputs 18 and 20 of integrator circuit 12 are defined respectively by a capacitor C10 and a capacitor C11 together with respective input switches I1 and I2 each of which is suitable for establishing an electrical connection between one of the plates of the corresponding capacitors and either the corresponding input or ground. The other plates of the capacitors C10 and C11 are connected together at a node N1. The node N1 is connected by a link switch member O1 which establishes an electrical connection between said node and either the inverting input to the integrator circuit 12 or else ground.

The inputs 22 and 24 of the integrator circuit 14 and the inputs 26 and 28 of the integrator circuit 16 are connected in the same way as the inputs 18 and 20.

It will be observed that each inverting input of the integrator circuits 12, 14, and 16 is connected by a respective capacitor C16, C17, and C18 to the output of the operational amplifier associated with each integrator circuit.

In practice, when the two-port filter network 2 is of the elliptical type, the output from integrator circuit 12 is connected by a capacitor C19 to the inverting input of the amplifier in integrator circuit 16, and the output of integrator circuit 16 is connected by a capacitor C20 to the inverting input of the operational amplifier of integrator circuit 12.

The two-port filter network 2 is said to be a two-phase network since the capacitors C10 to C15 are switched by two disjoint clock states: one state being called the working state and the other being called the "rest" state.

In order to linearize the phase/frequency response of the filter 2, two other integrator circuits having their respective inputs fitted with capacitors switched by two disjoint clock states are interconnected with each other and with the integrator circuits of the two-port network 2.

Figure 2:
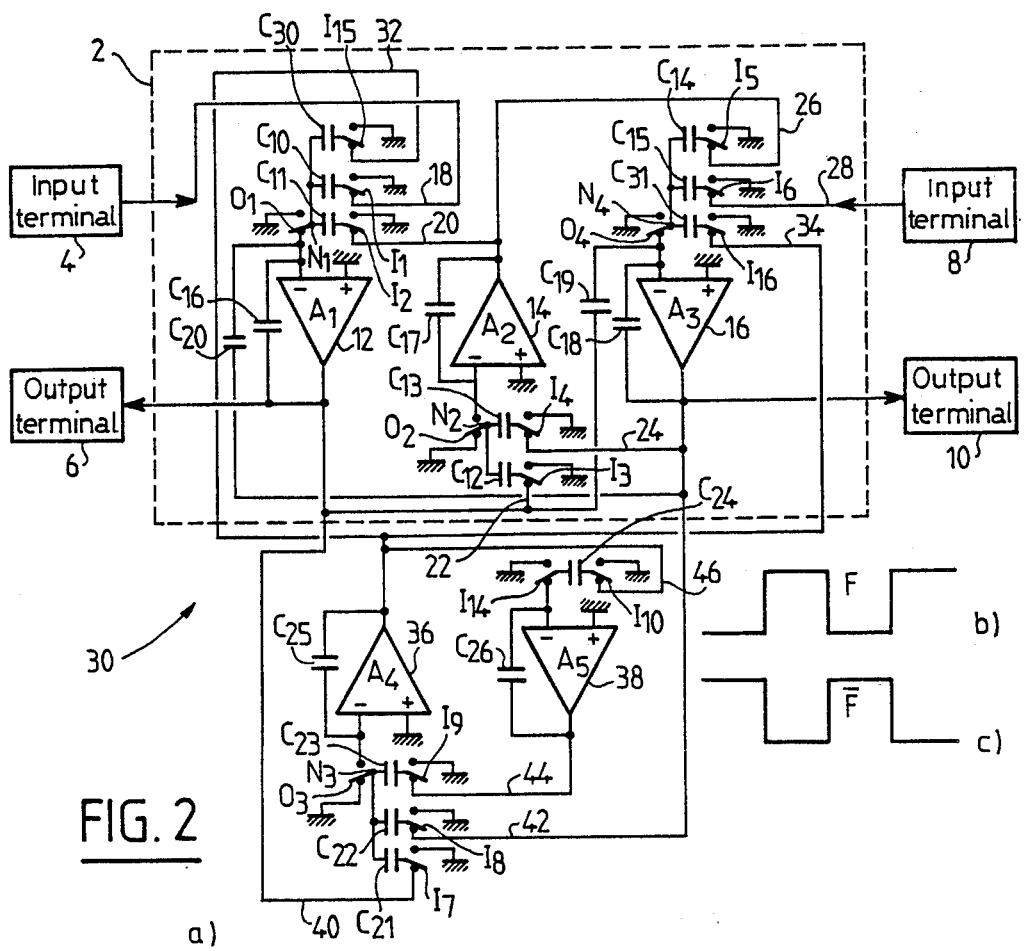
FIG. 2 is the diagram of the essential component parts of a switched capacitor filter in accordance with the invention.

In FIG. 2, reference 30 designates a two-port filter network in accordance with the invention. It includes the two-port filter network described with reference to FIG. 1 connected between input terminals 4 and 8 and output terminals 6 and 10. The integrator circuits 12 and 16 are provided with respective additional inputs 32 and 34. Two additional integrator circuits 36 and 38 are interconnected with each other and with the integrator circuits 12, 14, and 16 for the purpose of linearizing the phase/frequency response of the two-port filter network 30. The input 32 is defined by a switch I15 and a capacitor C30 having one of its plates connected to the switch I15 and having its other plate connected to node N1. Input 34 is defined by a switch I16 and by a capacitor C31 having one of its plates connected to switch I16 and having its other plate connected to node N4.

The integrator circuit 36 has three inputs, 40, 42, and 44. Input 40 is connected to the output from integrator circuit 12. Input 42 is connected to the output from integrator circuit 16. The output from integrator circuit 36 is connected to the additional inputs 32 and 34 of integrator circuits 12 and 16.

Integrator circuit 38 has only one input 46 which is also connected to the output from integrator circuit 36. The output from integrator circuit 38 is connected to the input 44 of integrator circuit 36.

Each of the integrator circuits 36 and 38 includes a respective operational amplifier A4 and A5 with its non-inverting input connected to ground and with its inverting input connected to the various inputs to said integrator circuits 36 and 38 via switched capacitors.

The inputs 40, 42, and 44 of the integrator circuit 36 are defined by respective capacitors C21, C22, and C23 together with input switches I7, I8, and I9 which serve to establish electrical connections between one of the plates on respective ones of the capacitors C21, C22, and C23 and either the corresponding input 40, 42, or 44 or else ground. The other plates of the capacitors C21, C22, and C23 are interconnected at a node N3 which is connected by a link switch member O3 either to ground or else to the inverting input of the amplifier A4.

Figure 3:
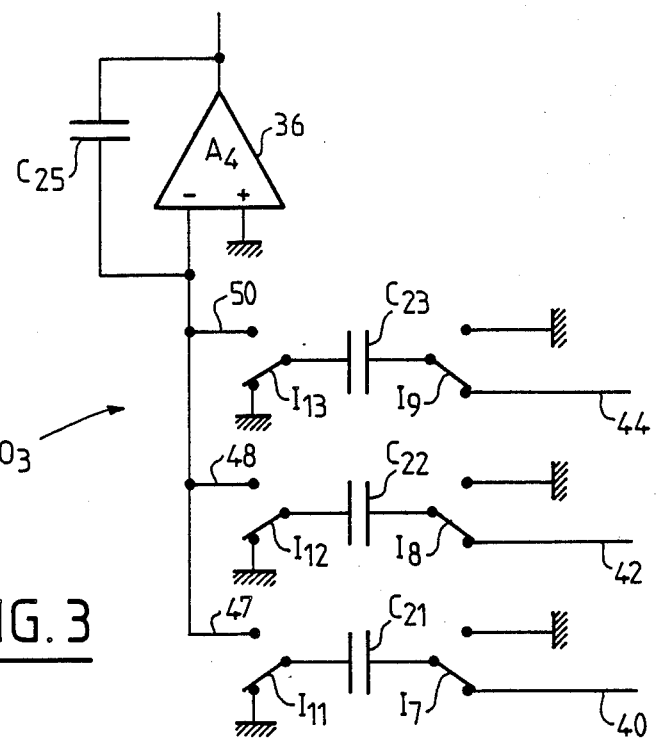
FIG. 3 shows a variant of the link switch member in accordance with the invention.

Reference is now made to FIG. 3 which shows a variant of link switch member O3. In FIG. 3, it can be seen that inputs 40, 42, and 44 are defined by respective switch-capacitor pairs I7-C21, I8-C22, and I9-C23. In this variant, the link switch member O3 comprises three switches I11, I12, and I13 each serving to establish an electrical connection between a corresponding other plate of a respective one of the capacitors C21, C22, and C23 and either electrical contact points 47, 48, and 50, or else ground, with electrical contact points 47, 48, and 50 being connected together and to the inverting input of the integrator 36.

Referring again to FIG. 2, it can be seen that the inverting inputs of amplifiers A4 and A5 are connected via respective capacitors C25 and C26 to the outputs of the amplifiers, thereby constituting the integrator circuits 36 and 38.

It may be observed that the input 46 to integrator circuit 38 is defined by capacitor C24 having one of its plates connected via a switch I10 either to the input 46 or else to ground, and having its other plate connected by a switch I14 either to ground or to the inverting input of the integrator circuit 38.

Portion (b) of FIG. 2 shows the state of a working clock at frequency F.

Portion (c) shows the state of a rest clock at frequency $\overline{F}$.

The capacitors C21, C22, C23, and C24 are switched by the two disjoint clock states F and $\overline{F}$.

The essential characteristic of the two-port filter network in accordance with the invention is to associate the two-port filter network 2 as described with reference to FIG. 1 with an additional structure constituted by the two interconnected integrator circuits which are connected with the two-port network 2 for the purpose of linearizing the phase/frequency response curve without disturbing the attenuation of the filter. It may be observed that the additional structure connected in parallel with the two-port network 2 is equivalent to passive components acting on phase for the purpose of linearizing the phase without disturbing the amplitude of the filter.

Figure 4:
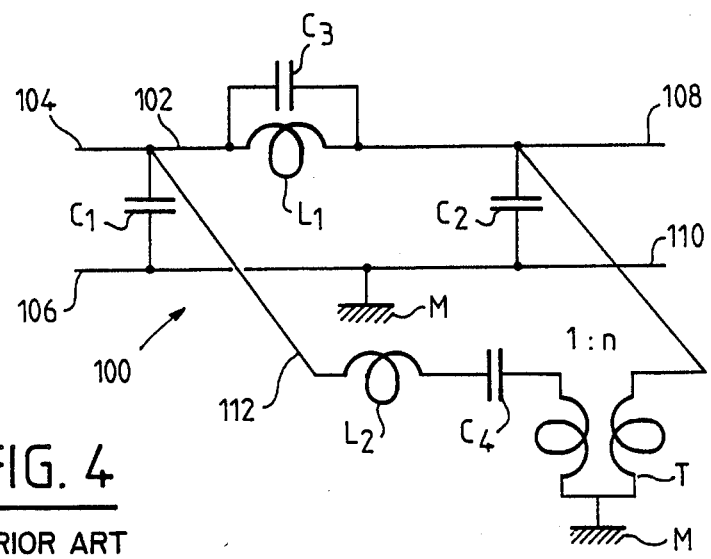
FIG. 4 is a diagram of a prior art passive component filter equivalent to the two-port filter network in accordance with the invention.

FIG. 4 shows a prior art two-port filter network which is equivalent to that described with reference to FIG. 2 and which is constituted by passive components for acting on phase without disturbing the amplitude of the filter.

In FIG. 4, reference 100 designates a passive component filter whose phase/frequency response curve is linear. The filter 100 comprises a basic cell 102 equivalent to the two-port filter network 2 described with reference to FIG. 1. The basic cell 102 comprises a capacitor C1 connected between two input terminals 104 and 102, a capacitor C2 connected between two output terminals 108 and 110, and an inductor L1 connected between one of the plates of capacitor C1 and one of the plates of capacitor C2. The other plate of capacitor C1 and the other plate of capacitor C2 are connected to ground. If the filter 102 is a so-called "elliptical" filter, then a capacitor C2 is connected in parallel with the inductor L1. The capacitors C1 and C2, and the inductor L1 are equivalent to integrator circuits 12, 14, and 16.

An additional circuit 112 is disposed between one of the plates of capacitor C1 and one of the plates of capacitor C2 for the purpose of acting on the phase of the filter without disturbing its amplitude. The circuit 112 comprises an inductor L2 connected in series with a capacitor C4 and a transformer T whose transformation ratio is 1/n.

The person skilled in the art knows that a circuit 112 has the effect of acting on the phase of the filter without disturbing its amplitude. The integrator circuits 36 and 38 in two-port filter network 30 described with reference to FIG. 2 are equivalent to the circuit 112. It may be observed that two-port filter network 30 provides four complex zeroes which are symmetrically disposed in the complex plane representing the transfer function of the filter. The person skilled in the art will understand that such a two-port network having complex zeroes is capable of acting on the phase of the filter without changing its amplitude.

Figure 5:
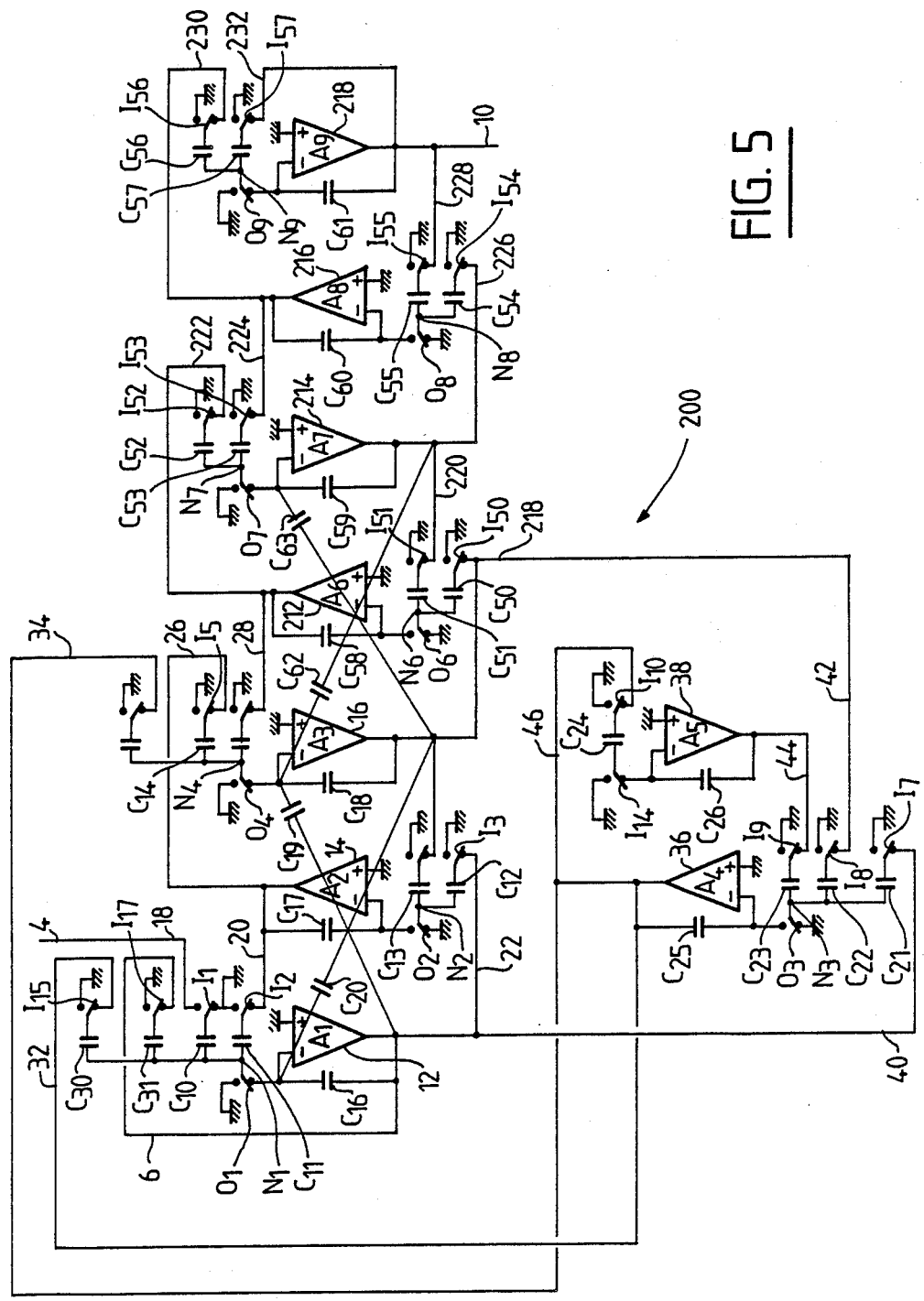
FIG. 5 shows a seventh order switched capacitor elliptical filter in accordance with the invention.

Reference is now made to FIG. 5 which shows a seventh order elliptical switched capacitor filter in accordance with the invention. The two-port filter network 200 in accordance with the invention comprises a ladder circuit constituted by three integrator circuits 12, 14, and 16 having two integrator circuits 36 and 38 connected thereto as described with reference to FIG. 2, together with four other integrator circuits interconnected with the three integrator circuits 12, 14, and 16, and also interconnected with each other.

The integrator circuit 12 has four inputs. Inputs 20 and 32 are defined like inputs 20 and 32 described with reference to FIGS. 1 and 2. Input 18 is directly connected to input terminal 4. Output terminal 6 described with reference to FIG. 1 defines the fourth input to integrator circuit 12 via a switch I17 and a capacitor C31.

Integrator circuit 212 has two inputs 218 and 220. Input 218 is connected to input 42 of integrator circuit 36 and to the output from integrator circuit 16. The output from integrator circuit 212 constitutes the input 222 of integrator circuit 214.

Integrator circuit 214 has two inputs 222 and 224. Input 224 is connected to the output from integrator circuit 216 and the output from integrator circuit 214 constitutes the input 226 of integrator circuit 216.

Integrator circuit 216 has two inputs 226 and 228. Input 228 is connected to the output from integrator circuit 218 and the output from integrator circuit 216 constitutes the input 230 to integrator circuit 218.

Integrator circuit 218 has two inputs 230 and 232. Input 232 is directly connected to the output from integrator circuit 218 which defines output terminal 10 of the two-port filter network 200.

Each of the integrator circuits 212, 214, 216, and 218 includes a respective operational amplifier A6, A7, A8, and A9, having its non-inverting input connected to ground and having its inverting input connected to the various different inputs of said integrated circuits via switched capacitors.

The inputs 218 and 220 of integrator circuit 212 are respectively defined by capacitors C50 and C51 and respective input switches I50 and I51. The other plates of capacitors C50 and C51 are interconnected at a node N6 which is connected via a link switch member O6 either to the inverting input of integrator circuit 212 or else to ground.

The inputs 222 and 224 of integrator circuit 214, the inputs 226 and 228 of integrator circuit 216, and the inputs 230 and 232 of integrator circuits 218 are all defined in the same way as inputs 218 and 220.

Each inverting input of the integrator circuits 212, 214, 216, and 218 is connected via a respective capacitor C58, C59, C60, and C61 to the output of the corresponding operational amplifier of the integrator circuit.

When the two-port filter network 200 is of the elliptical type, the output from integrator circuit 214 is connected by a capacitor C62 to the inverting input of integrator circuit 16, and the output from integrator circuit 16 is connected via a capacitor C63 to the inverting input of integrator circuit 214.

Two-port filter network 200 is a two-phase network by virtue of its switched capacitors changing state under the control of two disjoint clock states as described with reference to FIG. 2.

Naturally, other integrator circuits connected using the same structure as integrators 36 and 38 may be connected to a two-port filter network including a plurality of integrator circuits connected in the ladder structure of integrator circuits 12, 14, 16, 212, 214, 216, and 218.

Figure 6:
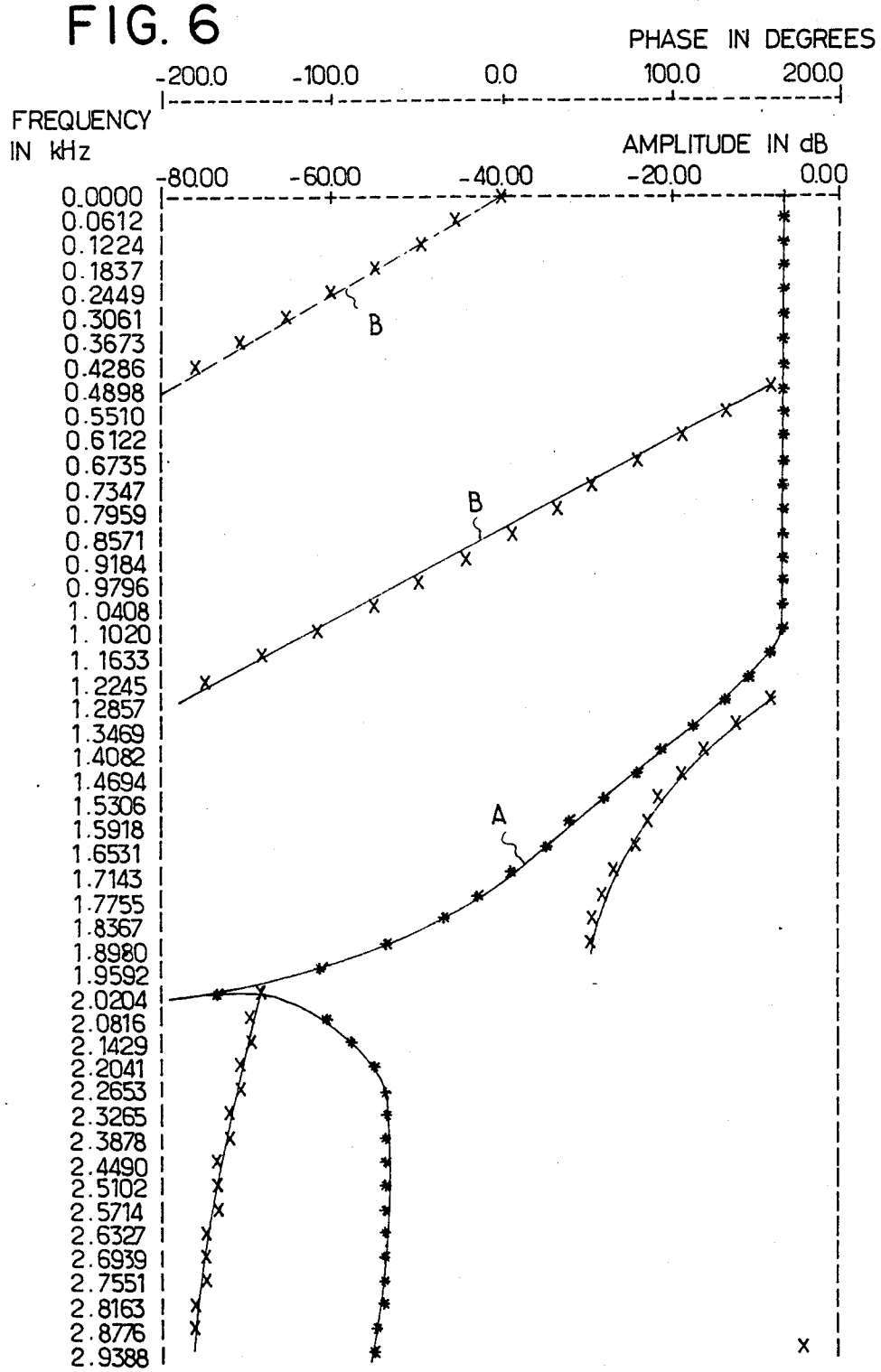
FIG. 6 is a graph showing the response of the FIG. 5 filter in accordance with the invention as a function of frequency.

Reference is now made to FIG. 6 which shows the response curves of the filter described with reference to FIG. 5. Frequency is plotted in kilohertz along the vertical axis. Amplitude in dB and phase in degrees are plotted along the horizontal axis.

It can be seen that the amplitude response relative to frequency for filter A is linear between −60 dB and −5 dB approximately. The linear phase variation of the filter as a function of frequency is illustrated by curves B.

A two-phase type seventh order two-port filter network 200 is thus provided having a phase/frequency response curve which is linear.

We claim:

1. A two-port switched capacitor filter network comprising:
   two input terminals;
   two output terminals;
   a first integrator circuit having three inputs provided with capacitors which are switched under control of first and second clock states which are distinct from each other, a first input of the first integrator circuit being connected to a first of the input terminals, and an output of the first integrator circuit being connected to a first of the output terminals;
   a second integrator circuit having two inputs provided with capacitors which are switched under control of the first and second clock states, with a first input of the second integrator circuit being connected to the output of the first integrator circuit and with an output of the second integrator circuit constituting a second input of the first integrator circuit;
   a third integrator circuit having three inputs provided with capacitors which are switched under control of the first and second clock states, the first input of the third integrator circuit being connected to the output of the second integrator circuit, the second input of the third integrator circuit being connected to a second of the input terminals and an output of the third integrator circuit being connected to a second of the output terminals and also to a second input of the second integrator circuit;
   a fourth integrator circuit having three inputs provided with capacitors which are switched under control of the first and second clock states, the first input of the fourth integrator circuit being connected to the output of the first integrator circuit and the second input of the fourth integrator circuit being connected to the output of the third integrator circuit, and an output of the fourth integrator circuit being connected to a third input of each of the first and third integrator circuits; and
   a fifth integrator circuit having a single input provided with a capacitor which is switched under control of first and second clock states, also connected to the output of the fourth integrator circuit and having an output connected to a third input of the fourth integrator circuit; said five integrator circuits being interconnected to constitute a sampling filter having a linear phase/frequency response.

2. A two-port network according to claim 1, wherein at least some of the integrator circuits comprise an operational amplifier having a non-inverting input connected to ground and an inverting input connected to the inputs of the integrator circuits via switched capacitors.

3. A two-port network according to claim 2, wherein each of the inputs of an integrator circuit comprise:
   a capacitor;
   an input switch suitable for establishing an electrical connection between one plate of the capacitor and either the input or ground; and
   a link switch member suitable for establishing an electrical connection between the other plate of the capacitor and either the inverting input or ground.

4. A two-port network according to claim 3, wherein the link switch member comprises a switch suitable for establishing electrical connection between a node and either the inverting input or ground, with the other plates of all the input capacitors of the integrator circuit being interconnected at the node.

5. A two-port network according to claim 3, wherein the link switch member comprises a plurality of switches each suitable for establishing an electrical connection between the other plate of the corresponding input capacitor of the integrator circuit and either a respective electric contact point or ground, with the electric contact points being interconnected and being connected to the inverting input of the integrator circuit.

6. A two-port network according to claim 2, wherein each inverting input of the integrator circuits is connected by a capacitor to the output of the operational amplifier of each integrator circuit.

7. A two-port network according to claim 1, wherein the output of the first integrator circuit is connected by a capacitor to the inverting input of the amplifier of the third integrator circuit, and wherein the output from the third integrator circuit is connected via another capacitor to the inverting input of the amplifier of the first integrator circuit, thereby obtaining a switched capacitor sampling filter of the elliptical type.

8. A two-port switched capacitor filter network comprising:
two input terminals;
two output terminals;
a first integrator circuit having three inputs provide with capacitors which are switched under control of first and second clock states which are distinct from each other, the first input of the first integrator circuit being connected to a first of the input terminals and an output of the first integrator circuit connected to the first of the output terminals;
a second integrator circuit having two inputs provided with capacitors which are switched under control of the first and second clock states, with a first input of the second integrator circuit being connected to the output of the first integrator circuit and with an output of the second integrator circuit constituting a second input of the first integrator circuit;
a third integrator circuit having three inputs provided with capacitors which are switched under control of the first and second clock states, a first input of the third integrator circuit being connected to the output of the second integrator circuit, a second input of the third integrator circuit being connected to a second of the input terminals; and an output of the third integrator circuit being connected to a second of the output terminals and also to a second input of the second integrator circuit;
a fourth integrator circuit having three inputs provided with capacitors which are switched under control of the first and second clock states, the first input of the fourth integrator circuit being connected to the output of the first integrator circuit and a second input of the fourth integrator circuit being connected to the output of the third integrator circuit, and an output of the fourth integrator circuit being connected to a third input of each of the first and third integrator circuits;
a fifth integrator circuit having a single input provided with a capacitor which is switched under control of first and second clock states, also connected to the output of the fourth integrator circuit and having an output connected to a third input of the fourth integrator circuit; said five integrator circuits being interconnected to constitute a sampling filter having a linear phase/frequency response; and
a plurality of supplementary integrator circuits, each having two inputs fitted with capacitors switched under the control of the clock states, the plurality of supplementary integrator circuits being interconnected with each other and in series with the first, second, third, fourth and fifth integrator circuits in order to constitute a multiple-order sampling filter having a linear phase/frequency response.

* * * * *